(12) United States Patent
Webster et al.

(10) Patent No.: US 9,548,414 B2
(45) Date of Patent: Jan. 17, 2017

(54) OPTICAL DEVICE BASED ON BISMUTH-CONTAINING III-V COMPOUND MULTILAYER SEMICONDUCTORS

(71) Applicant: Arizona Board of Regents on behalf of Arizona State University, Scottsdale, AZ (US)

(72) Inventors: Preston T. Webster, Tempe, AZ (US); Ankur R. Sharma, Malta, NY (US); Chaturvedi Gogineni, Tempe, AZ (US); Shane R. Johnson, Chandler, AZ (US); Nathaniel A. Riordan, Chandler, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 22 days.

(21) Appl. No.: 14/558,410

(22) Filed: Dec. 2, 2014

(65) Prior Publication Data
US 2015/0155420 A1    Jun. 4, 2015

Related U.S. Application Data

(60) Provisional application No. 61/911,235, filed on Dec. 3, 2013.

(51) Int. Cl.
*H01L 31/109* (2006.01)
*H01L 33/30* (2010.01)
(Continued)

(52) U.S. Cl.
CPC ....... *H01L 31/109* (2013.01); *H01L 31/03046* (2013.01); *H01L 31/035236* (2013.01); *H01L 33/06* (2013.01); *Y02E 10/544* (2013.01)

(58) Field of Classification Search
CPC .... H01L 31/109; H01L 33/0025; H01L 33/06; H01L 33/30; H01L 31/03046; H01L 31/035236; H01L 33/00; H01L 31/0352
See application file for complete search history.

(56) References Cited

U.S. PATENT DOCUMENTS

| | | | | |
|---|---|---|---|---|
| 5,650,635 A | * | 7/1997 | Razeghi | H01L 25/043 257/184 |
| 6,054,706 A | * | 4/2000 | Razeghi | H01L 31/03046 250/214.1 |

(Continued)

FOREIGN PATENT DOCUMENTS

| | | | | |
|---|---|---|---|---|
| WO | WO 98/57360 | * | 12/1998 | H01L 21/00 |
| WO | WO 2013/164567 | * | 11/2013 | H01S 5/343 |

OTHER PUBLICATIONS

Huan Liang, Ankur R. Sharma, Nathaniel. A. Riordan, Shane R. Johnson, "Vanishing Bandgaps in Broken-Band InAs0.94Bi0.06/GaSb Superlattices", 3rd International Workshop on Bismuth-Containing Semiconductors: Growth, Properties, and Devices, Victoria Canada, Jul. 2012.

(Continued)

*Primary Examiner* — Fazli Erdem
(74) *Attorney, Agent, or Firm* — Knobbe, Martens, Olson & Bear LLP (57) ABSTRACT

Optical devices based on bismuth-containing III-V compound semiconductor materials are disclosed. The optical device includes an optically active pseudomorphic superlattice formed on a substrate. The superlattice includes alternating $InAsSb_y$ layers (where y is greater than or equal to zero) and InAsBi layers.

19 Claims, 8 Drawing Sheets

(51) Int. Cl.
  *H01L 31/0304* (2006.01)
  *H01L 31/0352* (2006.01)
  *H01L 33/06* (2010.01)

(56) References Cited

U.S. PATENT DOCUMENTS

| | | | |
|---|---|---|---|
| 7,067,858 B2 | 6/2006 | Hase | |
| 2004/0077115 A1* | 4/2004 | Zhang | B82Y 10/00 438/47 |
| 2011/0204214 A1* | 8/2011 | Bahir | H01L 31/0304 250/214.1 |
| 2011/0254471 A1* | 10/2011 | Bahir | B82Y 20/00 315/363 |
| 2012/0074462 A1* | 3/2012 | Freundlich | H01L 31/03048 257/184 |
| 2012/0168816 A1* | 7/2012 | Sweeney | B82Y 20/00 257/103 |
| 2013/0207160 A1 | 8/2013 | Sasahata et al. | |
| 2015/0037925 A1* | 2/2015 | Evans | H01L 31/1844 438/94 |

OTHER PUBLICATIONS

Ankur R. Sharma, Huan Liang, Nathaniel A. Riordan, Chaturvedi Gogineni, Shane R. Johnson, "Extended Wavelength Photodetectors using Type-II GaInAsBi/GaAsSb Superlattices Lattice Matched to InP", 3rd International Workshop on Bismuth-Containing Semiconductors: Growth, Properties, and Devices, Victoria Canada, Jul. 2012.
Shane R. Johnson, Ankur R. Sharma, Preston T. Webster, Nathaniel A. Riordan, Chaturvedi Gogineni, "Pseudomorphic 2 to 3 μm Infrared Photodetectors with Improved Performance using GaInAsBi/GaAsSb Superlattices Lattice Matched to InP", First International Workshop on Infrared Technologies, Munich Germany, Nov. 2012.
Shane R. Johnson, Preston T. Webster, Nathaniel A. Riordan, Chaturvedi Gogineni, Huan Liang, Ankur R. Sharma, "Long wave infrared and vanishing bandgap III-V bismuth alloys", 4th International Workshop on Bismuth-Containing Semiconductors: Growth, Properties, and Devices, Fayetteville AR, Jul. 2013.
Shane R. Johnson, Preston T. Webster, Nathaniel A. Riordan, Chaturvedi Gogineni, "Development of III-V bismuth alloys for long wave infrared and vanishing bandgap optoelectronic devices", Heterogeneous Material Integration for Electronic, Optoelectronic, and Energy Conversion Devices Workshop, 30th North American Conference on Molecular Beam Epitaxy, Banff Canada, Oct. 2013.
Preston T. Webster, Jing Lu, Nathaniel A. Riordan, Chaturvedi Gogineni, Shi Liu, David J. Smith, Yong-Hang Zhang, Shane R. Johnson, "Bismuth as a constituent and a surfactant during III-V molecular beam epitaxy", Lawrence Symposium on Epitaxy 2014, Scottsdale AZ, Feb. 2014.
Shane R. Johnson, Preston T. Webster, Nathaniel A. Riordan, Chaturvedi Gogineni, Shi Liu, Jing Lu, David J. Smith, Yong-Hang Zhang, "Growth, Structural, and Optical Properties of InAsBi", 5th International Workshop on Bismuth-Containing Semiconductors: Growth, Properties, and Devices, Cork Ireland, Jul. 2014.
P. T. Webster, J. Lu, N. A. Riordan, E. H. Steenbergen, S. Liu, D. J. Smith, Y.-H. Zhang, and S. R. Johnson, "Optical Properties of InAs/InAsSb Superlattices Grown With and Without Bi as a Surfactant", presented at 18th International MBE Conference, Flagstaff, AZ, Sep. 8-12, 2014.
Preston T. Webster, Arvind J. Shalindar, Jing Lu, Nathaniel A. Riordan, Shi Liu, Elizabeth H. Steenbergen, Ron A. Synowicki, David J. Smith, Yong-Hang Zhang, Shane R. Johnson, "Molecular beam epitaxy growth of III-V materials at the GaSb lattice constant using bismuth as an alloy constituent and as a surfactant", 2015 Lawrence Workshop on Epitaxy, Tempe AZ, Feb. 2015.
Preston T. Webster, Arvind J. Shalindar, Yong-Hang Zhang, Shane R. Johnson, "Optical Properties of InAsBi Quantum Wells and Bulk Layers, 6th International Workshop on Bismuth-Containing Semiconductors: Growth, Properties, and Devices", Madison WI, Jul. 2015.
P. T. Webster, N. A. Riordan, C. Gogineni, S. Liu, J. Lu, X.-H. Zhao, D. J. Smith, Y.-H. Zhang, and S. R. Johnson, "Molecular beam epitaxy using bismuth as a constituent in InAs and a surfactant in InAs/InAsSb superlattices", J. Vac. Sci. Technol. B 32, 02C120 (2014).
Hua Li, Shi Liu, Oray O. Cellek, Ding Ding, Xiao-Meng Shen, Elizabeth H. Steenbergen, Jin Fan, Zhiyuan Lin, Zhao-Yu He, Qiang Zhang, Preston T. Webster, Shane R. Johnson, Lu Ouyang, David J. Smith, Yong-Hang Zhang, "A calibration method for group V fluxes and impact of V/III flux ratio on the growth of InAs/InAsSb type-II superlattices by molecular beam epitaxy", Journal of Crystal Growth 378, 145-149 (2013).
Gu et al. "Structural and optical characterizations of InPBi thin films grown by molecular beam epitaxy", Nanoscale Research Letters 2014, 9:24.
K. Wang et al., "InPBi Single Crystals Grown by Molecular Beam Epitaxy", Scientific Reports 4: 5449 (2014).
I.C. Sandall et al., "Demonstration of InAsBi photoresponse beyond 3.5μm", Applied Physics Letters 104, 171109 (2014).
S.J. Maddox, H.P. Nair, V.D. Dasika, E.M. Krivoy, R. Salas, and S.R. Bank, "Molecular Beam Epitaxy Growth-Space Investigation of InAsBi and InGaAsBi on InAs," International Symposium on Compound Semiconductors (ISCS), Santa Barbara, CA, Aug. 2012.
N. A. Riordan et al., "Temperature and pump power dependent photoluminescence characterization of MBE grown GaAsBi on GaAs", J. Mater. Sci.: Mater. Electron. 23, 1799 (2012).
C. Gogineni, N. A. Riordan, S. R. Johnson, X. Lu, and T. Tiedje, "Temperature and pump power dependent photoluminescence characterization of MBE grown GaAsBi on GaAs", Appl. Phys. Lett. 103, 041110 (2013).
Yu. G. Sadofyev, S. R. Johnson, S. A. Chaparro, Y. Cao, D. Ding, J.-B. Wang, K. Franzreb, and Y.-H. Zhang, "Sb-mediated growth of Si-doped AlGaAs by molecular-beam epitaxy", Appl. Phys. Lett. 84, 3546 (2004).
S. R. Johnson, Yu. G. Sadofyev, D. Ding, Y. Cao, S. A. Chaparro, K. Franzreb, and Y.-H. Zhang, "Sb-mediated growth of n- and p-type AlGaAs by molecular beam epitaxy", J. Vac. Sci. Technol. B 22, 1436 (2004).
I. Vurgaftman, J. R. Meyer, and L. R. Ram-Mohan, "Band parameters for III-V compound semiconductors and their alloys", J. Appl. Phys. 89, 5815 (2001).
I. Vurgaftman, J. R. Meyer, N. Tansu, L. J. Mawst, "(In)GaAsN-based type-II "W" quantum-well lasers for emission at λ=1.55 pm", Appl. Phys. Lett. 83, 2742 (2003).
H.-S. Cho and P. R. Prucnal, "New formalism of the Kronig-Penney model with application to superlattices", Phys. Rev. B 36, 3237 (1987).
N. J. Ekins-Daukes, K. Kawaguchi, and J. Zhang, "Strain-Balanced Criteria for Multiple Quantum Well Structures and Its Signature in X-ray Rocking Curves", Cryst. Growth Des. 2, 287 (2002).
K. Alberi, J. Wu, W. Walukiewicz, K. M. Yu, O. D. Dubon, S. P. Watkins, C. X. Wang, X. Liu, Y.-J. Cho, and J. Furdyna, "Valence-band anticrossing in mismatched III-V semiconductor alloys", Phys. Rev. B 75, 045203 (2007).
S.-H. Pan and S.-M. Feng, "General formalism of the Kronig-Penney model suitable for superlattice applications", Phys. Rev. B 44, 5668 (1991).
A. Janotti, Su-Huai Wei, and S. B. Zhang, "Theoretical study of the effects of isovalent coalloying of Bi and N in GaAs", Phys. Rev. B 65, 115203 (2002).
S. Francoeur, M.-J, Seong, A. Mascarenhas, S. Tixier, M. Adamcyk, and T. Tiedje, "Band gap of $GaAs_{1-x}Bi_x$, 0<x<E3.6%", Appl. Phys. Lett. 82, 3874 (2003).
V. Pacebutas, K. Bertulis, L. Dapkus, G. Aleksejenko, A. Krotkus, K. M. Yu, and W. Walukiewicz, "Characterization of low-temperature molecular-beam-epitaxy grown GaBiAs layers", Semicond. Sci. Technol. 22, 819 (2007).
S. Imhof et al., "Clustering effects in Ga(AsBi)", Appl. Phys. Lett. 96, 131115 (2010).

(56) References Cited

OTHER PUBLICATIONS

Z. M. Fang, K. Y. Ma, R. M. Cohen, and G. B. Stringfellow, "Photoluminescence of InAsBi and InAsSbBi grown by organometallic vapor phase epitaxy", J. Appl. Phys. 68, 1187 (1990).

J. Massies and N. Grandjean, "Surfactant effect on the surface diffusion length in epitaxial growth", Phys. Rev. B 48, 8502 (1993).

N. Grandjean, J. Massies, and V. H. Etgens, "Delayed Relaxation by Surfactant Action in Highly Strained III-V Semiconductor Epitaxial Layers", Phys. Rev. Lett. 69, 796 (1992).

J. Massies, N. Grandjean, and V. H. Etgens, "Surfactant mediated epitaxial growth of InxGa1-xAs on GaAs (001)", Appl. Phys. Lett. 61, 99 (1992).

S. Tixier, M. Adamcyk, E. C. Young, J. H. Schmid, and T. Tiedje, "Surfactant enhanced growth of GaNAs and InGaNAs using bismuth", J. Cryst. Growth 251, 449 (2003).

E. C. Young, S. Tixier, and T. Tiedje, "Bismuth surfactant growth of the dilute nitride GaNxAs1-x", J. Cryst. Growth 279, 316 (2005).

C. D. Consorte, C. Y. Fong, M. D. Watson, L. H. Yang, and S. Ciraci, "Model study of a surfactant on the GaAs (100) surface", Mater. Sc. Eng. B 96, 141 (2002).

\* cited by examiner

OPTICAL DEVICE BASED ON BISMUTH-CONTAINING III-V COMPOUND MULTILAYER SEMICONDUCTORS

CROSS-REFERENCE TO RELATED APPLICATION

This application claims the benefit of U.S. Provisional Application No. 61/911,235, filed Dec. 3, 2013, the content of which is hereby incorporated by reference in its entirety.

STATEMENT REGARDING FEDERALLY SPONSORED R&D

This invention was made with government support under DMR-0909028 awarded by the National Science Foundation. The government has certain rights in the invention.

BACKGROUND

1. Field of the Invention

The disclosed technology relates generally to optical devices, and more particularly to optical devices based on bismuth-containing III-V compound semiconductor materials.

2. Description of the Related Art

Semiconductor optical devices operate based on the absorbing or emitting photons. In a semiconductor emitter, electrons and holes that are separated by an energy gap, e.g., a bandgap of an active region, recombine in the active region to emit photons that have an energy corresponding to the energy gap. In a semiconductor detector, upon absorbing photons in an active region, electrons and holes separated by an energy gap, e.g., a band gap of the active region, are created and subsequently collected as current. By choosing a semiconductor material having a particular energy gap, the energies (or corresponding wavelengths) of the photons that are emitted or absorbed can be tuned. For example, for infrared applications, compound semiconductors including alloys of Group III and Group V elements of the periodic table (also known as III-V semiconductors) are often used because III-V semiconductors have band gap energies in the infrared spectrum. Furthermore, a plurality of Group III elements and/or a plurality of Group V elements can be alloyed to form ternary or more complex semiconductors having band gap energies that are different than the band gap energies of the constituent binary III-V semiconductors. However, practical combinations of the elements of the Groups III and V can be limited by various factors such as, for example, limited intermixing or segregation of the constituent elements and generation of defects (e.g., dislocations) during synthesis, among other limitations. For example, when a thin III-V semiconductor film having a certain bulk lattice constant is grown on a substrate having a smaller or larger lattice constant, the resulting thin film is strained. The presence of such strain can limit the thickness of the III-V semiconductor film that is grown before strain-induced defects, e.g., misfit dislocations, are formed in the thin film. Such defects can degrade various performance metrics of the optical devices formed therefrom, such as quantum efficiency and current leakage.

SUMMARY

An optical device according to some embodiments includes a substrate and an optically active pseudomorphic superlattice formed on the substrate. The superlattice includes alternating InAsBi layers with InAs or InAsSb layers.

An optical device according to some other embodiments includes a substrate having a substrate lattice constant and an optically active multilayer stack formed on the substrate. The multilayer stack includes an $InAs_{1-y}Sb_y$ layer having y greater than or equal to zero and a first lattice constant selected such that the $InAs_{1-y}Sb_y$ layer is under a first strain, and further includes an InAsBi layer with a second lattice constant selected such that the InAsBi layer is under a second strain opposite in sign to the first strain, wherein the thicknesses and compositions of the InAsSb and InAsBi layers are chosen such that a net strain of the multilayer stack is smaller in magnitude than each of the first strain and the second strain.

DETAILED DESCRIPTION

Infrared devices, e.g., infrared emitters and detectors, have many industrial, scientific, military and medical applications. In particular, infrared detectors allow imaging of objects without the aid of visible light and can be used, for example, to detect persons or animals at night, to observe changing blood flow in the skin, to detect overheating of electrical apparatuses, and to image various interstellar objects, to name a few applications. Some infrared optical devices employ semiconductor materials. In particular, various compound semiconductors, formed by alloying elements of Groups III and V or by alloying elements of Groups II and VI, have been employed to make optically active elements of the optical devices. Despite the existence of many elements of Groups III and V that can be alloyed to form optically active elements for infrared optical devices, combinations of elements that can be used to form the active elements have been limited by various practical considerations. For example, growth of some III-V semiconductors having high quality and useful thicknesses on certain substrates may be difficult due, for example, to generation of strain-induced defects (e.g., dislocations) that may arise from a lattice mismatch from the underlying substrate. For example, when a III-V semiconductor film having a larger lattice constant is grown on a substrate having a smaller lattice constant, the resulting strain can limit the thickness of the III-V semiconductor film that can be grown on the substrate before the III-V semiconductor "relaxes," which tends to be accompanied by strain-induced defects therein, e.g., misfit dislocations. Such defects can degrade the performance of the optical devices such as, e.g., by lowering quantum efficiency and/or increasing leakage currents in operation. Thus, there is a need for compound semiconductor material systems, e.g., III-V semiconductor material systems, that can provide a wide tunable infrared response range and can also be formed in relatively large thicknesses without forming strain-induced defects.

Although some embodiments disclosed herein are described with respect to optical sensing devices such as infrared detectors, the skilled artisan will appreciate in view of the disclosure herein that certain features of the embodiments can similarly apply to optical emitters such as infrared emitters.

In the following, embodiments of InAsSb/InAsBi or InAs/InAsBi superlattices based on different band alignment types (Type I InAs/InAsBi, and Type II InAsSb/InAsBi) are disclosed for infrared optical applications, whose optical responses can cover an entire infrared spectral range below the bandgap energy of InAs (0 eV to 0.354 eV, or greater than about 3.5 μm in wavelength at room temperature). As described herein, semiconductor heterostructures form a Type I band alignment if both conduction and valence bands of a first layer are offset in opposite directions relative to conduction and valence bands of a second layer. Superlattices having Type I band alignments are referred to herein as Type I superlattices. In contrast, semiconductor heterostructures form a Type II band alignment if conduction and valence bands of a first layer are offset in the same energy direction relative to conduction and valence bands of a second layer. Superlattices having Type II band alignments are referred to herein as Type II superlattices. The superlattices can advantageously be grown to have arbitrarily thick thicknesses while forming little or no strain-induced defects when grown on substrates such as GaSb, such that the optical devices formed using the superlattices have high external quantum efficiency.

As described herein, infrared light refers to photons having wavelengths between about 780 nm and about 1 mm.

As described herein, it will be understood that a semiconductor material referred by their constituent elements, e.g., InAsSb, without particular fractions of each constituent element with respect to the whole, can have any mole fractions of constituent elements that can occur in grown films, unless specified otherwise. Where intended to encompass either InAsSb or InAs, the term "InAsSb$_y$" is employed, where y can be greater than or equal to 0 (i.e., Sb is optional), but the relative mole fractions of In and As are not specified. Alternatively, the term "InAs$_{1-y}$Sb$_y$" is employed, where y can be greater than or equal to 0 (i.e., Sb is optional). Similarly, InAsBi signifies the presence of all three elements without specifying the mole fractions of the elements, while InAs$_{1-x}$Bi$_x$ signifies a variable but interrelated ratio of As:Bi.

Bandgap Energies and Cutoff Wavelengths of InAsBi and InAsSb

Figure 1:
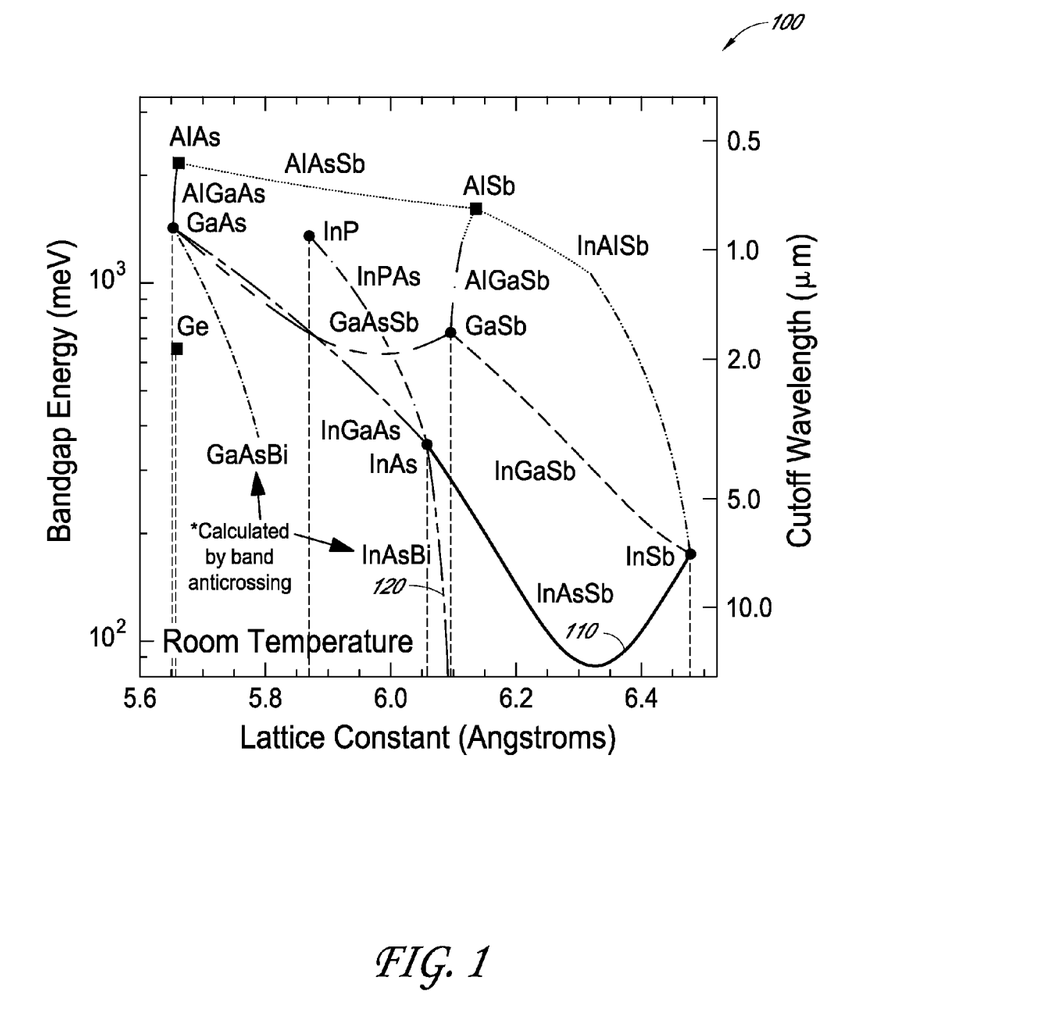
FIG. 1 illustrates bandgap energies and cutoff wavelengths of various III-V semiconductors plotted as functions of lattice constant, including InAs, InAsBi, and InAsSb, that can be used as component layers of superlattices according to various embodiments.

FIG. 1 is a graph 100 illustrating bandgap energies (Eg) and cutoff wavelengths (or absorption edges) of various III-V semiconductors plotted as functions of lattice constant (d). In particular, Eg versus d curves (Eg-d curves) 120 and 110 of InAsBi and InAsSb, respectively, which can be used as component layers of superlattices according to various embodiments, are illustrated. In the graph 100, the right and left y-axes represent bandgap energy (Eg) and cutoff wavelength, and the x-axis represents the lattice constant (d). As used herein, the cut-off wavelength, sometimes referred to as absorption edge, corresponds to the wavelength below which the corresponding semiconductor material starts to absorb or emit a significant amount of photons above background levels, and can correspond to energies at or above the Eg of the semiconductor material. According to FIG. 1, many ternary III-V semiconductor alloys have bandgaps in the infrared. However, many alloys are difficult to be fabricated as optically active elements of infrared optical devices because of their relatively large lattice mismatch to widely available substrates including, e.g., Ge, GaAs, InP, InAs and GaSb and InSb, indicated by vertical dashed lines).

In particular, because black body radiation at 300K has a peak wavelength between about 9 μm and 11 μm, InAsSb-based semiconductors, represented by the E-d curve 110, that is optically active between about 8 μm and 12 μm, is an attractive material system. However, InAsSb has a lattice constant between lattice constants of InAs and of InSb, which are 6.0584 Å and 6.4794 Å, respectively, and the resulting alloy has a relatively large lattice mismatch with respect to some desirable substrates, e.g., a GaSb substrates, which has a lattice constant of 6.0959 Å. Consequently, in many applications where InAsSb is used as an optically active material, it is grown as a strained film. However, when the strained InAsSb layer is grown as a single film to a thickness above a certain critical thickness, the InAsSb layer "relaxes" by forming energetically favorable defects (e.g., misfit dislocations). When present, these defects can form paths for excessive leakage and/or form nonradiative recombination centers, thereby degrading the performance of the optical device (e.g., by reducing the signal to noise ratio). On the other hand, if the InAsSb layer is grown sufficiently thin to accommodate the strain without relaxation, the resulting InAsSb may not provide sufficient thickness for absorbing enough photons to overcome noise.

Referring to the E-d curve 120, the InAsBi material system offers an attractive alternative to the InAsSb material system because absorption of wavelength ranges exceeding that achievable by the InAsSb can be achieved in the InAsBi material system with a relatively small concentration of Bi. The Eg of the InAsBi system varies much more rapidly with lattice constant compared to the InAsSb system. As a result, for the same range of wavelengths achievable with the InAsSb system, the corresponding InAsBi system can have much less strain when formed on GaSb, which allows for much greater thicknesses to be formed on GaSb without inducing strain-induced defects. However, even the InAsBi films cannot be grown to thicknesses exceeding microns, which can be desired for certain applications such as detectors having high external quantum efficiency. Thus, in the following, various embodiments of superlattices that can reap the benefit of rapidly varying Eg of the InAsBi system while simultaneously overcoming the thickness limitations of the single films of InAsSb and/or InAsBi material systems are disclosed. The superlattices including alternating InAsBi and $InAs_{1-y}Sb_y$ layers are disclosed, which advantageously have a wide range of tunable active wavelengths in the infrared. According to embodiments, by choosing the type of band alignment between InAsBi and $InAs_{1-y}Sb_y$ layers and compositions and thicknesses of the InAsBi and $InAs_{1-y}Sb_y$ layers, the superlattices can be tuned to be optically active between the bandgap energy of InAs (0.354 μm in wavelength) and near zero energy (e.g., >1 mm in wavelength). In addition, according to embodiments, by designing a net strain in the superlattice stacks to be very small, e.g., zero, a strain-balanced superlattice can be formed on GaSb with arbitrary superlattice thicknesses with little or no strain-induced defects.

Infrared Optical Devices Based on InAsSb/InAsBi Superlattices

Figure 2:
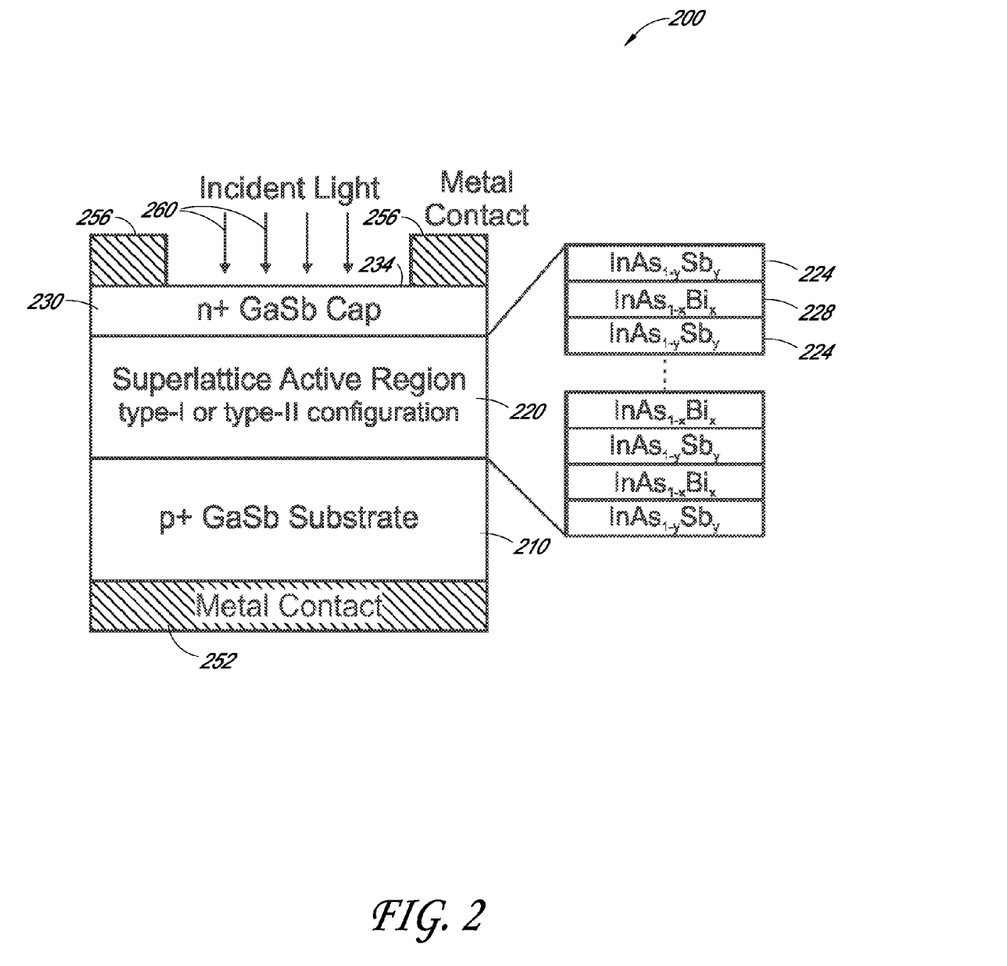
FIG. 2 illustrates an optical device based on superlattices comprising alternating $InAs_{1-y}Sb_y$ layers and InAsBi layers, which can be either a Type I superlattice or a Type II superlattice, according to embodiments.

FIG. 2 illustrates an infrared optical device 200 based on superlattices comprising alternating $InAs_{1-y}Sb_y$ layers and InAsBi layers, according to embodiments. The device 200 includes a substrate 210 of a first dopant type, e.g., a p+ GaSb substrate, and an optically active pseudomorphic superlattice 220 formed on the substrate. The superlattice 220 includes alternating $InAs_{1-y}Sb_y$ layers 224 and InAsBi 228 layers, wherein the $InAs_{1-y}Sb_y$ layers 224 have a first composition represented a formula $InAs_{1-y}Sb_y$, where y≥0, or where a Sb/In ratio is greater than or equal to zero (representing InAs or InAsSb), and wherein the InAsBi layers 228 have a second composition represented by a formula $InAs_{1-x}Bi_x$, where x>0, or where a Bi/In ratio is greater than zero, e.g., greater than 0.01%. In various embodiments, the $InAs_{1-y}Sb_y$ layers 224 and the InAsBi layers 228 are at least partially strain-compensated. That is, a net strain of the superlattice as a whole is smaller in magnitude compared to the stains of the individual $InAs_{1-y}Sb_y$ and InAsBi layers 224 and 228, as described in more detail infra. The device 200 additionally includes a cap 230 of a second dopant type, e.g., an n+ GaSb cap. The superlattice 220 may have a relatively low dopant concentration, e.g., such that the substrate 210, the superlattice 220 and the cap 230 are configured as a PIN diode. The PIN diode can be contacted using a first contact 252 to the substrate 210 and a second contact 256 to the cap 230.

In the illustrated embodiment, the device 200 is configured as a semiconductor infrared detector that is configured to absorb photons 260, received at a surface 234 and passed through the cap 230 and into the superlattice 220. In particular, when photons 260 having energies exceeding the energy gap (or the band gap) of the superlattice 220 is received by the superlattice 220, they are absorbed in the superlattice 220, and electrons and holes separated by the energy gap are created. The electrons and holes are subsequently collected at first and second contacts 252 and 256, respectively, as current. It will be appreciated that a band gap of a superlattice can be different than band gaps of the component layers of the superlattice. As described herein, the energy gap or the band gap of a superlattice refers to the lowest energy ground state transition energy in the superlattice miniband structure.

It will be appreciated that in other embodiments, the device 200 can also be configured as an infrared emitter configured to emit photons at the surface 234. When configured as an emitter, electrons and holes separated by energies exceeding an energy gap, e.g., band gap, may be injected into the superlattice 220 from the cap 230 and the substrate 210, respectively, and recombine in the superlattice 220, to emit photons that have an energy corresponding to the energy gap (or band gap) of the superlattice 220.

In some embodiments where the device 200 is an infrared detector, the device is configured to absorb a photon having energy equal to or greater than a band gap of the superlattice 220. In some embodiments where the device 200 is an infrared emitter, the device is configured to emit a photon having energy greater than or equal to a band gap of the superlattice 220.

Method of Designing InAsSb/InAsBi Superlattices

Figure 3:
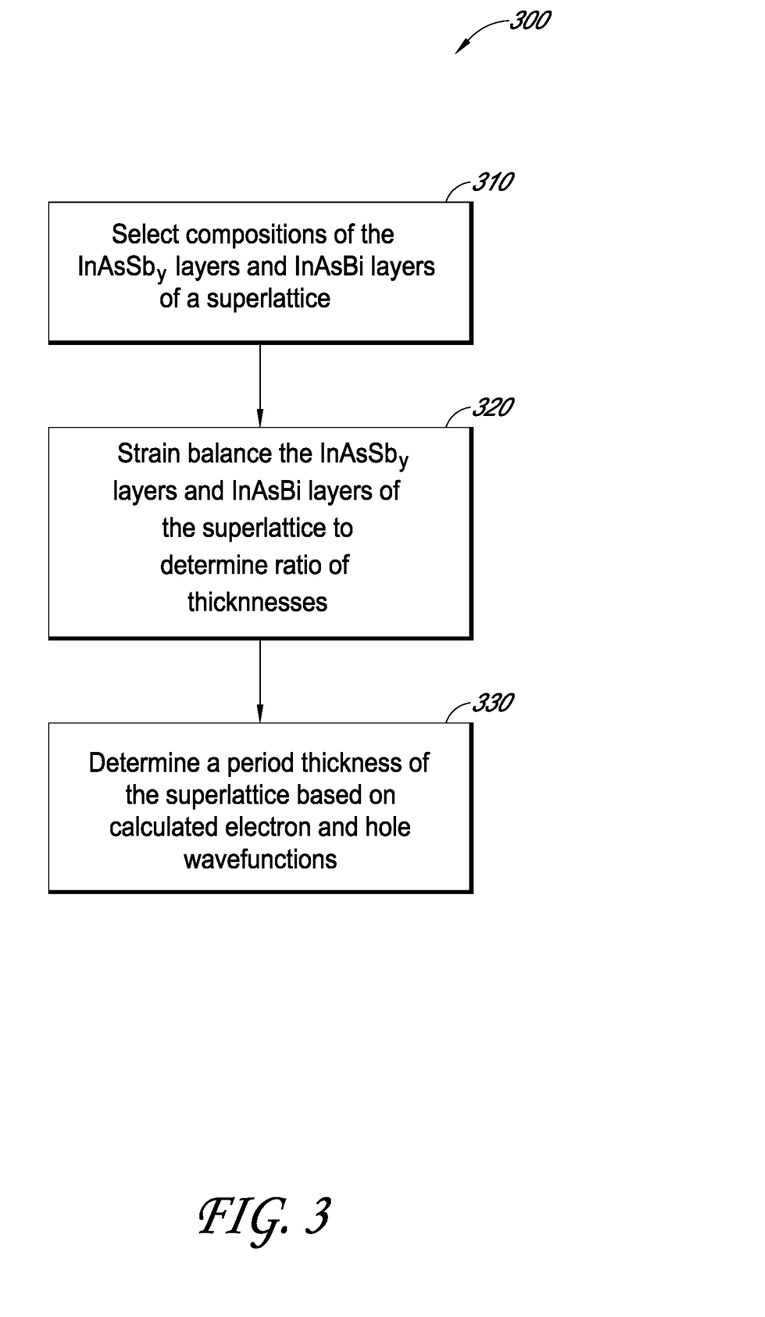
FIG. 3 illustrates a method of designing a superlattice comprising alternating $InAs_{1-y}Sb_y$ layers and InAsBi layers, according to various embodiments.

FIG. 3 illustrates a method 300 of designing a superlattice comprising alternating $InAs_{1-y}Sb_y$ layers and InAsBi layers, according to embodiments. The method 300 includes selecting 310 compositions of the $InAs_{1-y}Sb_y$ layers and the InAsBi layers. Selecting 310 includes selecting Bi content based on a desired spectral response wavelength in the infrared between 0 eV and the bandgap energy of InAs (0.354 eV), using a calculated energy versus composition curve. The method 300 additionally includes strain-balancing 320 the $InAs_{1-y}Sb_y$ layers and InAsBi layers of the superlattice to determine a ratio between $InAs_{1-y}Sb_y$ layer thickness and InAsBi layer thickness such that the resulting net strain in the superlattice is smaller in magnitude than the strains of the InAsSb and InAsBi component layers. The method 300 further includes determining 330 a period thickness of the superlattice based on calculated electron and hole wavefunctions, and optimizing for maximum wavefunction overlap square of the electron and hole wavefunctions ($\psi_e$, $\psi_h$) in the superlattice. Each of the processes 310, 320 and 330 are described in more detail in the following, with respect to FIGS. 4-8. Selecting compositions in the method of designing a superlattice includes selecting compositions of the constituent layers. Selecting 310 a composition of the InAsBi layer (e.g., Bi content) based on desired spectral response of the optical device is described below with respect to FIG. 4, and selecting a type (Type I or Type II) of superlattice based on the desired Bi content is described below with respect to FIG. 5. Determining 330 a period thickness based on calculated electron and hole wavefunctions ($\psi_e$, $\psi_h$) is described with respect to FIGS. 6 and 7 for Type II superlattices and with respect to FIG. 8 for Type I superlattice.

Figure 4:
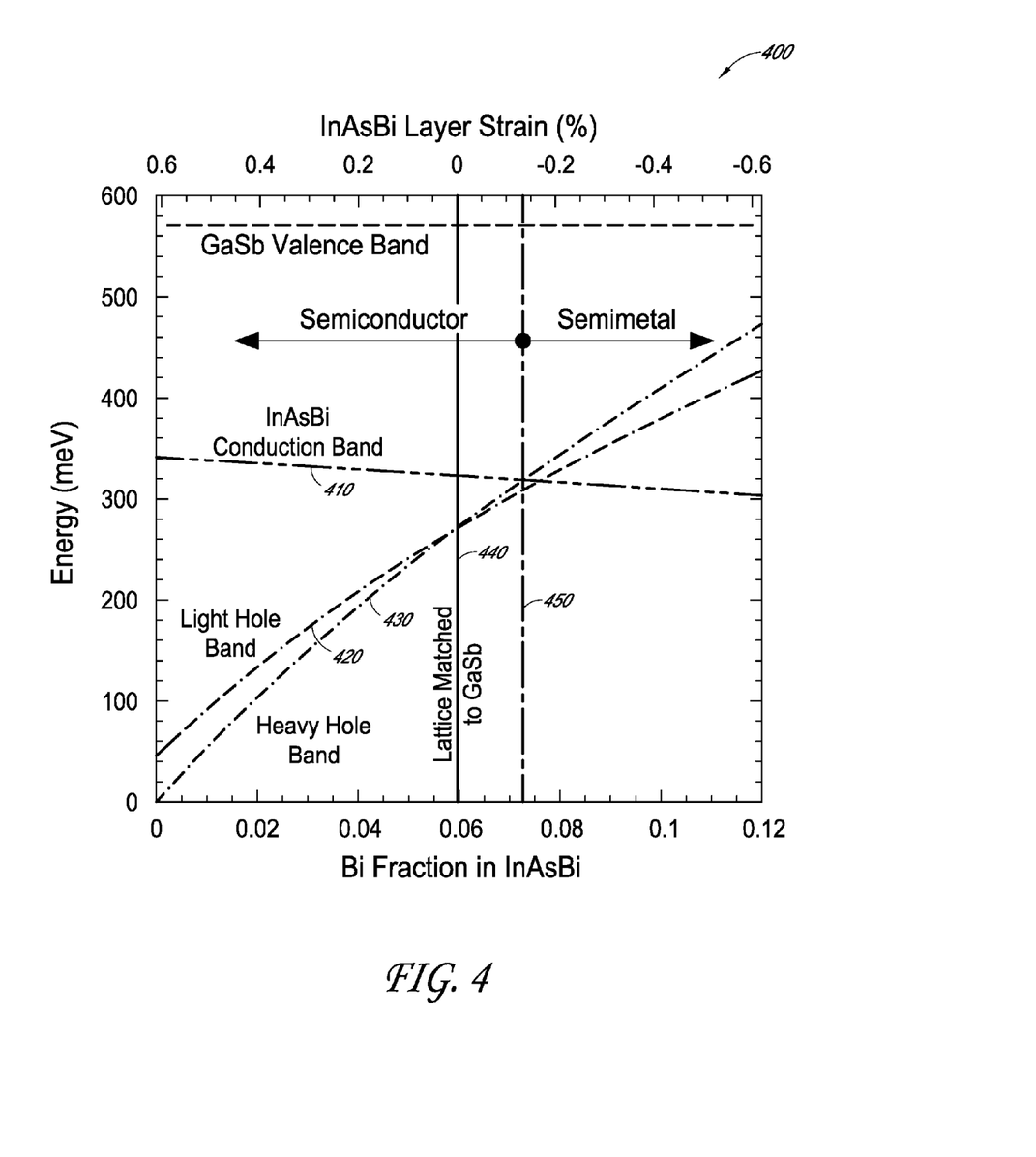
FIG. 4 illustrates calculated conduction and valence band edge energies of InAsBi layers as component layers of superlattices, according to various embodiments.

FIG. 4 is a graph 400 illustrating conduction and valence band edge energies of various InAsBi compositions that can be used as component layers of superlattice designs, according to various embodiments. In particular, calculated energies of various energy bands of InAsBi relative to a heavy hole band of the InAs (0% Bi) are plotted. In the graph 400, the y-axis represents the calculated energy, and first and second x-axes represent Bi fraction (Bi/In fraction, or alternatively x of $InAs_{1-x}Bi_x$) and InAsBi layer strain relative to GaSb, respectively. In the illustrated embodiments, by way of example and without being bound to any theory, the unstrained band parameters of InAsBi are calculated using a valence band anti-crossing model, and the effect of strain is calculated using the Pikus-Bir Hamiltonian where the material parameters of InAs are used, in calculations where corresponding values for InAsBi are unavailable. As illustrated, the conduction band curve 410 monotonically decreases with increasing Bi content, and the light hole and heavy hole valence band curves 420 and 430, respectively, monotonically increase with Bi content, between Bi fraction (e.g., Bi/In ratio) of about 0 (e.g., >0 or >0.01%) and 0.12. A band gap for a particular composition can be determined based on a difference between the conduction band curve 410 and the higher of the two valence band curves 420 and 430. Starting from InAs (i.e., zero Bi fraction), the bandgap of InAsBi reduces with increasing Bi content by approximately 55 meV per percent Bi until the band gap reduces to about 50 meV at a lattice matched Bi fraction 440 of about 0.06, corresponding to a composition where the lattice constant of the InAsBi is matched to that of a GaSb substrate, and further reduces until a semimetal Bi fraction 450 is reached, at which point the material becomes semi-metallic (band gap reduces to zero) at around Bi/In ratio of about 7.25%. Beyond the semimetal Bi fraction 450, the InAsBi is expected to behave as a metal, because the conduction and valence bands overlap.

Type I and Type II InAsSb/InAsBi Superlattices

Figure 5:
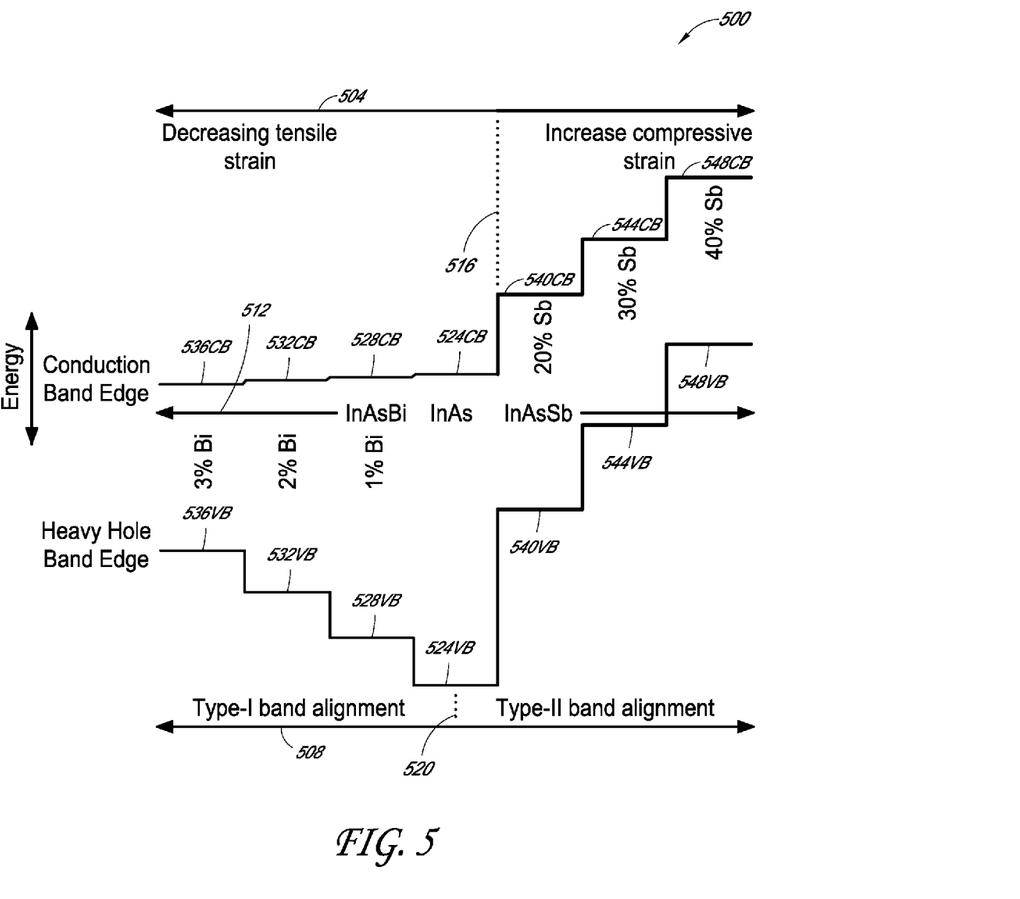
FIG. 5 illustrates schematic conduction and valence band alignments of strained InAs, strained InAsBi and strained InAsSb layers that can be used as component layers of Type I or Type II superlattices, according to various embodiments.

FIG. 5 illustrates schematic conduction and valence band alignments of strained InAs, strained InAsBi and strained InAsSb layers that can be used as component layers of Type I or Type II superlattices, according to various embodiments. The y-axis of the graph 500 represents relative energies of the conduction and valence band minima of the various strained component layers. The top x-axis 504 represents the strain in the various layers with respect to GaSb, with a demarcation 516 separating tensile strain from compressive strain. The middle x-axis 512 represents increasing Bi content in InAsBi to the left of InAs and increasing Sb content in InAsSb to the right of InAs. The bottom x-axis 508 represents whether the various InAsBi layers form a Type I alignment with respect to InAs or the various InAsSb layers form a Type II alignment with respect to an InAsBi composition. As described herein, semiconductor heterostructures form a Type I band alignment if both conduction and valence bands of a first layer are offset in opposite directions relative to conduction and valence bands of a second layer. Superlattices having Type I band alignments are referred to herein as Type I superlattices. In contrast, semiconductor heterostructures form a Type II band alignment if conduction and valence bands of a first layer are offset in the same energy direction relative to conduction and valence bands of a second layer. Superlattices having Type II band alignments are referred to herein as Type II superlattices.

Still referring to FIG. 5, graph 500 illustrates two groups of component layers that can be included in one of Type I or Type II superlattices. The first group includes component layers for Type I superlattices formed on GaSb, where the superlattices have alternating layers of InAsBi and InAs (i.e., $InAs_{1-y}Sb_y$ where y is zero). Type I superlattices that can be formed based on illustrated component layers include, e.g., alternating stacks of InAs/InAsBi (1% Bi), InAs/InAsBi (2% Bi) and InAs/InAsBi (3% Bi). Each of the InAsBi (1% Bi), InAsBi (2% Bi) and InAsBi (3% Bi) layers have respective conduction bands 528CB, 532CB and 536CB that are offset to have lower energies with respect to a conduction band 524CB of InAs, and have respective valence bands 528VB, 532VB and 536VB that are offset to have higher energies with respect to a valence band 524VB of InAs. Thus, each of the stacks InAs/InAsBi (1% Bi), InAs/InAsBi (2% Bi) and InAs/InAsBi (3% Bi) layers form heterostructures having Type I band alignments.

Still referring to FIG. 5, the second group includes component layers for Type II superlattices formed on GaSb, where the superlattices have alternating layers of InAsBi and InAsSb. Type II superlattices that can be formed based on illustrated component layers include, e.g., one of InAsBi (1% Bi), InAsBi (2% Bi) and InAsBi (3% Bi) which alternate with one of InAsSb (20% Sb), InAsSb (30% Sb) and InAsSb (40% Sb). Each of the InAsBi (1% Bi), InAsBi (2% Bi) and InAsBi (3% Bi) layers have respective conduction bands 528CB, 532CB and 536CB that are offset to have lower energies with respect to each of the InAsSb (20% Sb), InAsSb (30% Sb) and InAsSb (40% Sb) layers having respective conduction bands 540CB, 544CB and 548CB. In addition, each of the InAsBi (1% Bi), InAsBi (2% Bi) and InAsBi (3% Bi) layers have respective valence bands 528VB, 532VB and 536VB that are offset to also have lower energies with respect to each of the InAsSb (20% Sb), InAsSb (30% Sb) and InAsSb (40% Sb) layers having respective valence bands 540VB, 544VB and 548VB. Thus, each of the InAsBi (1% Bi), InAsBi (2% Bi) and InAsBi (3% Bi) layers form heterostructures having Type II band alignments when stacked with any one of the InAsSb (20% Sb), InAsSb (30% Sb) and InAsSb (40% Sb) layers.

It will be appreciated that in each of the Type I (InAs/InAsBi) and Type II (InAsSb/InAsBi) heterostructures design groups described above with respect to FIG. 5, the two layers that alternate have opposite signs of strains with respect to the GaSb substrate, such that the resulting superlattices are at least partially strain-balanced (i.e., a first strain in one layer negates or compensates a second strain in an adjacent, e.g., contacting layer). In the Type I heterostructure design group described above with respect to FIG. 5 above, at least partial strain-balance is achieved between tensilely strained InAs and compressively strained InAsBi layers. In the Type II heterostructure design group, at least partial strain-balance is achieved between tensilely strained InAsBi and compressively strained InAsSb layers.

Strain-Balancing to Determine a Thickness Ratio Between Component InAsSb and InAsBi Layers Referring back to FIG. 3, after selecting compositions as described above with respect to FIGS. 4 and 5, a strain-balancing thickness ratio between the $InAs_{1-y}Sb_y$ and InAsBi component layers of the superlattice is determined. The ratio of thicknesses of the component layers of a superlattice, in which one component layer is under a tensile strain while the other is under a compressive strain, can be determined based on respective strains ($\epsilon_{tensile}$ and $\epsilon_{compressive}$) and thicknesses (thicknesses $d_{tensile}$ and $d_{compressive}$) of the respective layers. By way of example and without being bound to any theory, a net strain $\epsilon_{net}$ of a stack of the component layers having a total thickness $d_{total}$ can be calculated by a thickness-weighted method according to the equation:

$$d_{total}\epsilon_{net} = d_{tensile}\epsilon_{tensile} + d_{compressive}\epsilon_{compressive} \quad [1]$$

Because the signs of $\epsilon_{tensile}$ and $\epsilon_{compressive}$ are opposite, the resulting magnitude of $d_{total}\epsilon_{net}$ is smaller than the magnitudes of each of $d_{tensile}\epsilon_{tensile}$ and $d_{compressive}\epsilon_{compressive}$. Using this approach, the Type I and Type II superlattices have strains and thicknesses of the $InAs_{1-y}Sb_y$ and InAsBi component layers chosen such that a combined net strain of the multilayer stack is smaller in magnitude than that of each of the component layers. In some embodiments, the superlattices have a net strain between 0% and ±0.6% which can be grown up to 0.1 μm (e.g., 1 nm to 0.1 μm) thick without relaxation, between 0% and ±0.08% which can be grown up to 1.0 μm (e.g., 0.1 μm to 1.0 μm) thick without relaxation, or between 0% and ±0.01% which can be grown up to 10.0 μm (e.g., 1 μm to 10 μm) thick without relaxation. The net strains specified herein can be inclusive or exclusive of 0%. It will be appreciated that in some embodiments, the superlattice can be designed to have a net strain of about zero such that $$d_{tensile}\epsilon_{tensile} + d_{compressive}\epsilon_{compressive} = 0 \quad [2]$$

In other embodiments, however, only a partial strain-balance is achieved between tensilely strained InAs and compressively strained InAsBi layers in a Type I heterostructure design, such that the net strain has a nonzero value. Similarly, only a partial stain-balance is achieved between tensilely strained InAsBi and compressively strained InAsSb layers in a type II heterostructure design, such that the net strain has a nonzero value. By strain-balancing the InAsBi and $InAs_{1-y}Sb_y$ layers as disclosed herein, the superlattice can be grown to a thickness exceeding 1 µm, 10 µm or even 100 µm with little or no strain-induced dislocations.

Referring back to FIG. 3, after selecting compositions and strain-balancing to determine the ratio of thicknesses of the $InAs_{1-y}Sb_y$ and InAsBi layers, the method 300 of designing the superlattice additionally includes determining 330 a period thickness of the superlattice based on calculated quantum-mechanical electron and hole wavefunctions. The inventors have found that, based on quantum-mechanical considerations, at least partially strain-balanced Type II InAsBi/InAsSb superlattices can be advantageously optimized to cover mid- to long-wavelength infrared regions (e.g., 3 µm to 12 µm, or 8 µm to 12 µm, for instance 10 µm) by incorporating Bi (e.g., as measured by Bi/In ratio) in the InAsBi between about 0% and about 6%, for instance about 3%, while at least partially strain-balanced Type I InAsBi/InAs superlattices can be optimized to cover longer wavelengths (e.g., wavelengths longer than about 12 µm) by incorporating Bi (e.g., as measured by Bi/In ratio) in the InAsBi of about 6% and greater. However, it will be appreciated that either of the superlattice types can effectively cover the entire infrared range below the bandgap of InAs, for example, Bi/In ratio that is greater than zero (>0), within a range between about zero (e.g., >0.01%) and about 20%, or within a range between about zero (e.g., >0.01%) and a semiconductor-to-semimetal transition composition (e.g., 7.25%). In the following, determining 330 the period thickness is described below with respect to FIGS. 6-7 for Type II superlattices, followed by FIG. 8 for Type I superlattices.

Determining Period Thicknesses of Type II InAsSb/InAsBi Superlattices

Strain-balanced Type II InAs/InAsSb superlattices that do no not contain Bi have been used for applications that cover mid- to long-wavelength infrared regions (e.g., 3.0 µm to 12 µm at a low temperature and 3.5 µm to 20 µm at room temperature). As described herein, a low temperature refers to a temperature below room temperature for operation of infrared optical devices, e.g., at liquid nitrogen temperature. However, the Type II InAs/InAsSb superlattices suffer from reduced overlap of the electron and hole wavefunctions (or square of the wavefunction overlap) to reach these longer wavelengths. As described herein, an overlap of wavefunctions ($\psi$) refers to a degree of overlap between electron and hole wavefunctions ($\psi_e$ and $\psi_h$) in physical space, as determined by solutions to quantum mechanical calculations. Without being bound to any theory, a squared value of the wavefunction overlap can be an indicator of probabilities of co-presence of electrons and holes, which in turn can be a factor in determining emission and absorption efficiency (and hence absorption coefficient) of the semiconductor superlattice. Inventors have found that introducing Bi into the InAs layers and forming an InAsBi/InAsSb superlattice can substantially improve the wavefunction overlap and square of the overlap. In particular, increasing Bi mole fraction in the tensilely strained InAsBi layers modifies the InAsBi/InAsSb band alignment so as to allow for better hole wavefunction coupling, resulting in stronger electron-hole wavefunction overlap for a given transition energy in the superlattice. In the following, for illustrative purposes, wavefunction overlap of ground state energies of Bi-free InAs/InAsSb superlattices are described first with respect to FIG. 6, followed by improvements achieved by adding Bi to the InAs to form the InAsSb/InAsBi Type II superlattices with respect to FIG. 7, according to embodiments.

Figure 6:
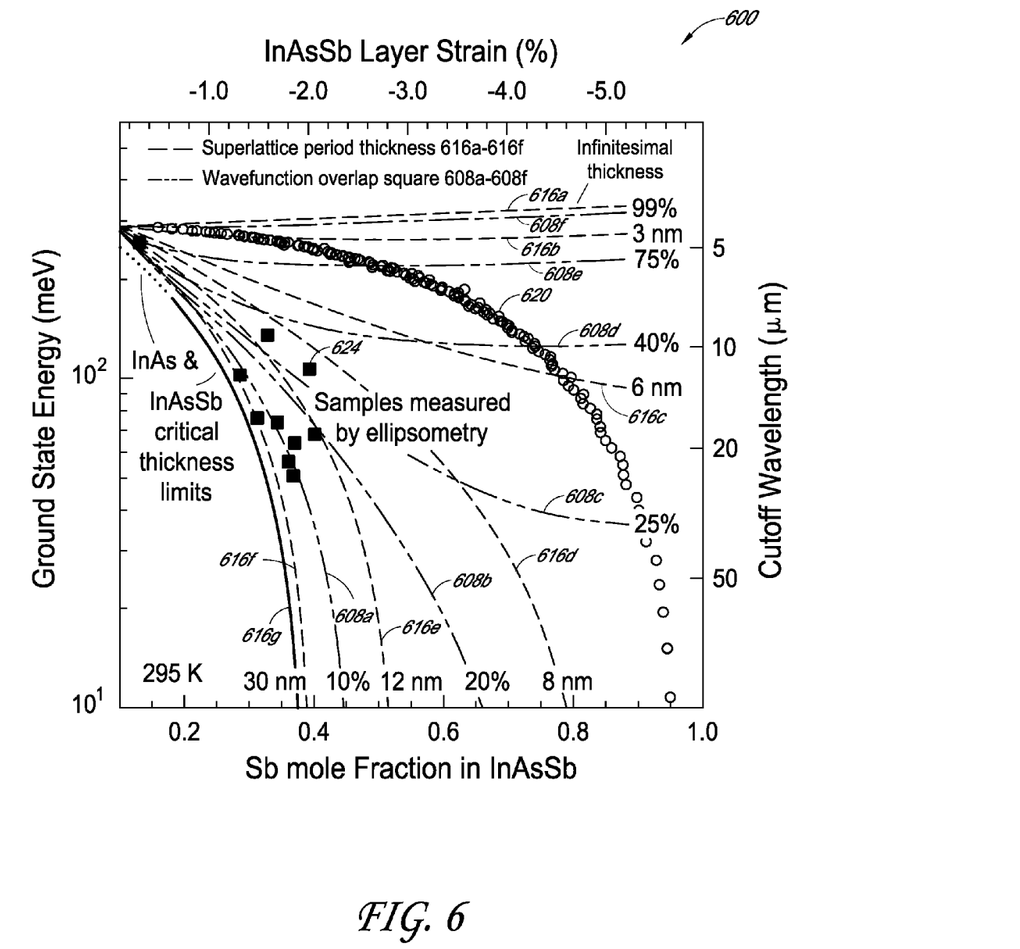
FIG. 6 illustrates ground state transition energies and cutoff energies of strain-balanced InAs/InAsSb superlattices, plotted as a function of the Sb mole fraction in the InAsSb layers.

FIG. 6 shows a graph 600 illustrating ground state transition energies and cutoff energies of strain-balanced InAs/InAsSb Type II superlattices. The left and right y-axes of the graph 600 represent ground state transition energy and cutoff wavelengths, while the upper and lower x-axes represent the strain and Sb mole fraction in the InAsSb layers of the Type II superlattices. Experimental data 624 represent InAs/InAsSb superlattice samples measured by spectroscopic ellipsometry, which were used to determine the InAs/InAsSb band alignment for the wavefunction overlap calculations using, e.g., Kronig-Penney model.

The graph 600 illustrates ground state transition energies for various superlattice period thicknesses 616a (infinitesimal thickness, e.g., less than one monolayer of each constituent layer), 616b (3 nm), 616c (6 nm), 616d (8 nm), 616e (12 nm), 616f (30 nm) and 616g (critical thicknesses of InAs and InAsSb for misfit dislocation formation). The graph 600 additionally illustrates ground state transition energies for various values of wavefunction overlap square values 608a (10%), 608b (20%), 608c (25%), 608d (40%), 608e (70%) and 608f (99%). As illustrated, generally, lower values of ground state transition energy (and conversely greater cutoff wavelength) can be reached by increasing the Sb content for a given periodicity, or by increasing the period thickness. From the perspective of achieving the maximum absorption coefficient, it may be desirable to maximize the electron-hole wavefunction overlap square values for various period thickness and Sb concentration combinations. These criteria correspond to minima in the wavefunction overlap square contours, which indicate the smallest possible transition energy for maximum wavefunction overlap square, and are represented in FIG. 6 by a maximum wavefunction overlap square contour 620. It can thus be seen that the InAs/InAsSb superlattice system can generally reach longer wavelengths in exchange for wavefunction overlap.

Based on this observation, the inventors have used similar model calculations using, e.g., Kronig-Penney model, to determine the optimal superlattice design as a function of transition energy based on maximizing wavefunction overlap in various Type II InAsBi/InAsSb superlattices. Inventors have found that, by maximizing the wavefunction overlap square, absorption coefficient of the InAsBi/InAsSb Type II superlattice can be improved surprisingly by several thousand $cm^{-1}$ in the technologically important 8 µm to 12 µm wavelength region with the incorporation of only a few percent of Bi in the InAs layers.

Figure 7:
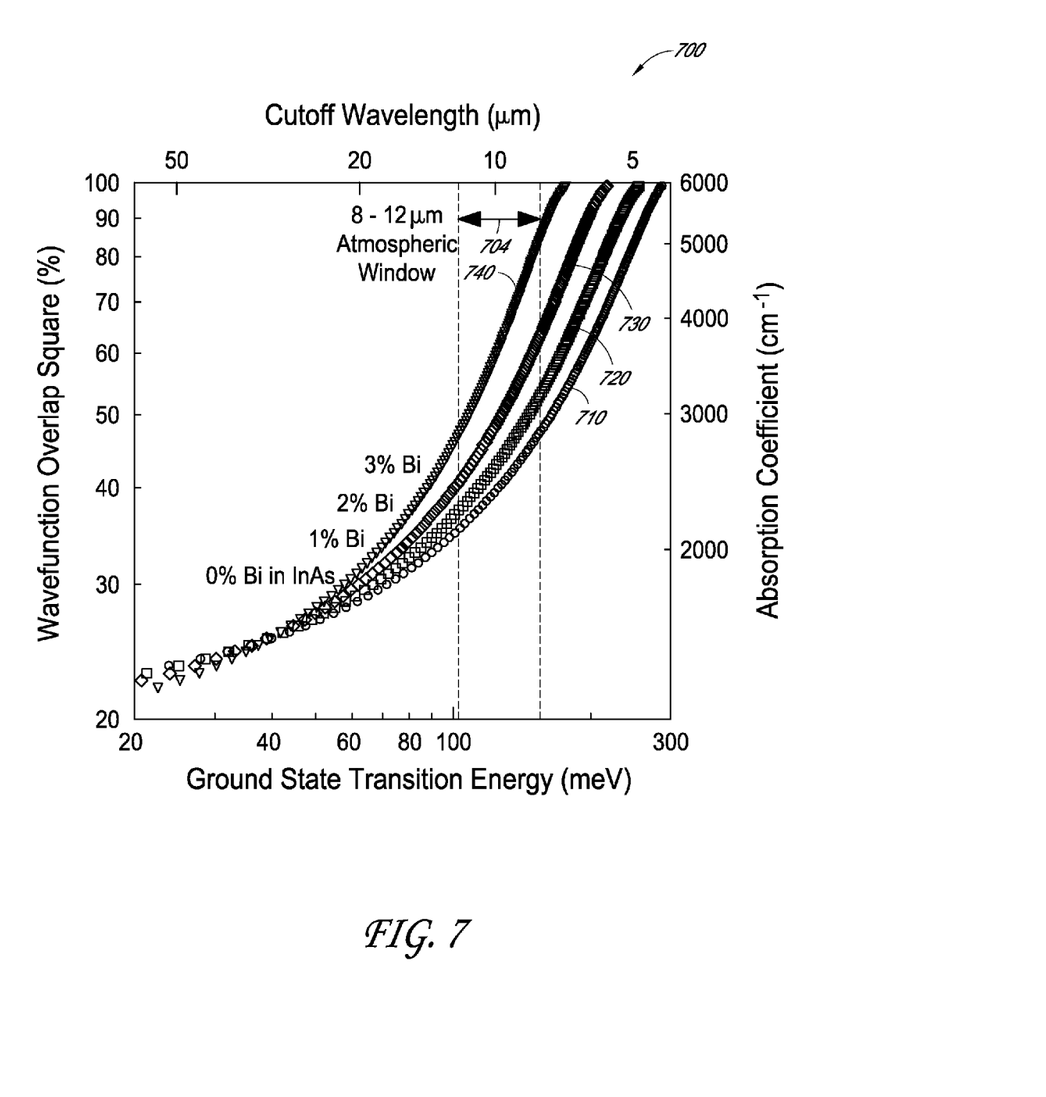
FIG. 7 illustrates wavefunction overlap square values and absorption coefficients of strain-balanced InAsBi/InAsSb superlattices designed according to various embodiments.

FIG. 7 is a graph 700 illustrating wavefunction overlap square and absorption coefficient of strain-balanced InAsBi/InAsSb superlattices designed according to embodiments described herein, plotted as a function of the ground state transition energy of the superlattices. Left and right y-axes represent wavefunction overlap square and absorption coefficients, respectively, and upper and lower x-axes represent cutoff wavelength and ground state transition energy of the superlattices, respectively. The graph 700 illustrates maximum wave function overlap curves 710, 720, 730 and 740 representing InAsBi/InAsSb Type II superlattices having Bi/In ratios of 0% (e.g., InAs/InAsSb), 1% (e.g., $InAs_{0.99}Bi_{0.01}$/InAsSb), 2% (e.g., $InAs_{0.98}Bi_{0.02}$/InAsSb) and 3% (e.g., $InAs_{0.97}Bi_{0.03}$/InAsSb), respectively. As illustrated, adding Bi to InAs has the effect of rapidly reducing the bandgap primarily through the upward shift in the valence band edge. As a result, without being bound to any theory, holes in the InAsBi/InAsSb superlattices are considerably better coupled with increasing Bi content compared to InAs/InAsSb, leading to stronger electron-hole wavefunction overlap in the superlattice. Thus, by adding small amounts (few percent) of Bi to form the InAsBi layer of the superlattice, the wavefunction overlap for a given transition energy is significantly improved, resulting in an increase in the absorption coefficient. The technologically important 8 to 12 μm wavelength region 704 is indicated as a vertical dashed lines, within which it can be seen that by adding just a few percent Bi (1 to 3%) into InAs can result in a large (at least one hundred and up to several thousand $cm^{-1}$) increase in the absorption coefficient, thereby significantly offsetting the reduced wavefunction overlap inherent in superlattice systems that rely on type-II band alignment without Bi addition to the InAs layer.

Thus, for a desired cutoff wavelength and based on the wavefunction overlap square as described above with respect to FIG. 6, and in view of the expected degree of improvement in absorption coefficient with the addition of Bi as described above with respect to FIG. 7, the period thickness can be chosen for desired spectral response of the infrared optical devices.

Still referring to FIG. 7, at wavelengths greater than 12 μm at a low temperature (below room temperature, e.g., liquid nitrogen temperature) and greater than 20 μm at room temperature, the benefits of adding Bi begin to diminish in Type II superlattices. Without being bound to any theory, this is believed to be a result of the need for longer period thicknesses to access these small transition energies which acts to again decouple the hole wavefunctions and reduce wavefunction overlap. Inventors have found that beyond about 12 μm at a low temperature and 20 μm at room temperature, an InAs/InAsBi Type I superlattice according to embodiments can be advantageous, as described below.

Determining Period Thicknesses of Type I InAs/InAsBi Superlattices

As described above, for very long wavelengths exceeding about 12 μm at a low temperature and about 20 μm at room temperature, the inventors have found that the hole wavefunctions begin to decouple due to the longer period thicknesses required to reach the longest wavelength transitions. For these very long-wavelength applications, the inventors have found that a Type I superlattice based on InAs/InAsBi (i.e., y=0 or Sb/In ratio=0) can be advantageous, in which the Bi mole fraction can be increased above 0.06 to make the InAsBi layers compressively strained, and restoring the wavefunction overlap in the long-wavelength infrared that may be lost due to long period thicknesses required in the InAs/InAsSb type II configuration. The Type I superlattices can be designed to have a strong wavefunction overlap, with ground state transition energies as low as 0 eV (i.e., a resulting material with semimetallic properties). These long wavelengths are achieved due to the large bandgap reduction rate of Bi in InAsBi, and the confinement effects of the InAs layers, which make the ground state transition energy tuneable.

Figure 8:
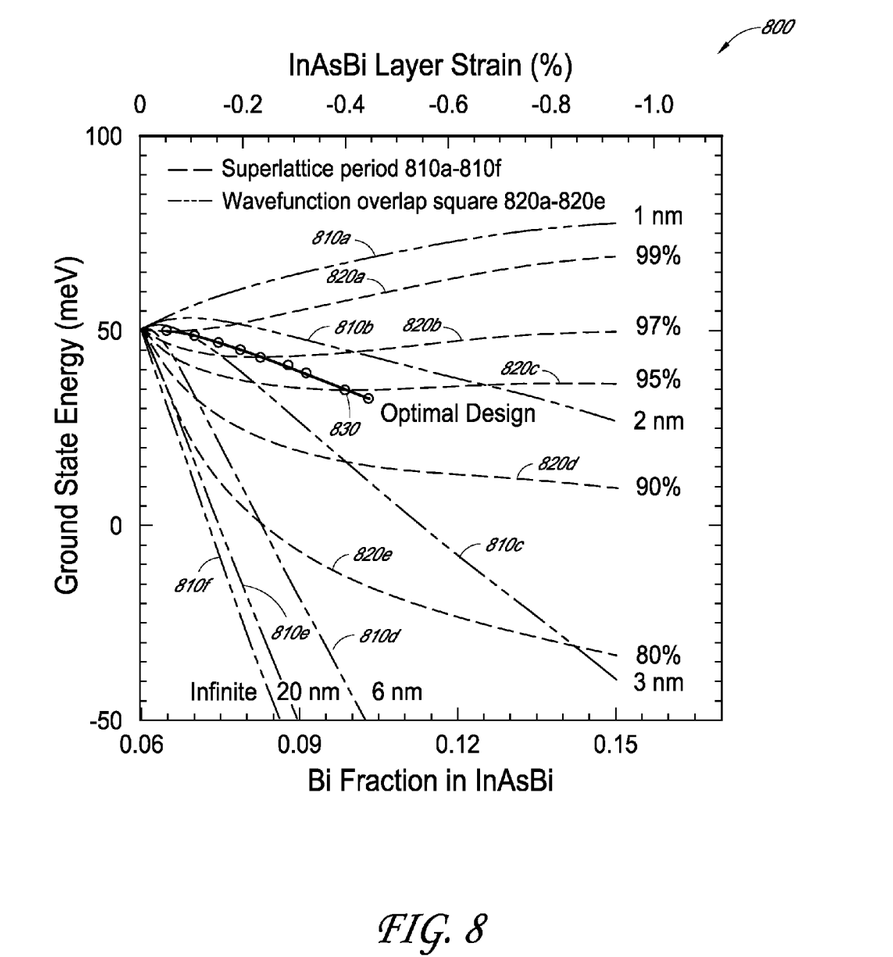
FIG. 8 illustrates ground state transition energies of the strain-balanced InAs/InAsBi superlattices designed according to various embodiments, plotted as a function of the Bi mole fraction in the InAsBi layers.

FIG. 8 is a graph 800 illustrating ground state transition energies of the strain-balanced InAs/InAsBi superlattices designed according to various embodiments, plotted as a function of Bi fraction in the InAsBi layer. The graph 800 illustrates ground state transition energies for various superlattice period thicknesses 810a (1 nm), 810b (2 nm), 810c (3 nm), 810d (6 nm), 810e (20 nm) and 810f (infinite thickness). The graph 800 additionally illustrates ground state transition energies for various values of wavefunction overlap square values 820a (99%), 820b (97%), 820c (95%), 820d (90%) and 820e (80%). As illustrated, various designs considerations can be obtained based on the desired cutoff wavelength range. Generally, lower values of ground state transition energy can be reached by increasing the Bi concentration, or increasing the Bi/In ratio, or by increasing the period thickness. As a result, multiple superlattice designs can obtain the same ground state transition energy or the corresponding cutoff wavelength. From the perspective of achieving maximum absorption strength, it may be desirable to maximize the electron-hole wavefunction overlap for various period thickness and Bi concentration combinations. These criteria correspond to minima in the wavefunction overlap square contours, which indicate the smallest possible transition energy for maximum wavefunction overlap, represented in FIG. 8 by a maximum wavefunction overlap square contour 830. Similar to Type II superlattices described above with respect to FIG. 6, it can thus be seen that the InAs/InAsBi superlattice system can reach very long wavelengths in exchange for wavefunction overlap.

It will be appreciated that the Type I InAs/InAsBi superlattice is different in several aspects from the Type II InAsSb/InAsBi superlattice. For a given composition of InAsBi which is now the compressively strained layer in the strain-balanced superlattice, the band alignment of the InAs/InAsBi, the design space for the thickness ratio of InAs to InAsBi and the periodicity can be calculated in a similar manner as described above for the Type II InAsSb/InAsBi superlattices described above. Unlike Type II superlattices, however, due to the Type I band alignment, the values of the wavefunction overlap square are much larger and this material system accesses longer wavelengths (greater than 12 μm at a low temperature and greater than 20 μm at room temperature).

The illustrated maximum wavefunction overlap square contour 830 can be obtained using a set of equations below, in one embodiment.

$$x_{Bi} = 0.06 + 0.026 \Big/ \ln\left(\frac{14.42}{49.84 - E_{Cutoff}} + 1\right) \quad [3]$$

$$\text{Period} = 2.25 + 605 * \exp(-95.3 * x_{Bi}) \quad [4]$$

$$\text{Strain Ratio} = SR = \frac{0.0062}{\frac{6.0959}{6.0583 + (0.4211) * x_{Bi}} - 1} \quad [5]$$

$$d_{InAs} = \frac{\text{Period}}{SR + 1} \quad [6]$$

$$d_{InAsBi} = \text{Period} - d_{InAs} \quad [7]$$

In the equations [3]-[7], $x_{Bi}$ corresponds to Bi/In ratio in the InAsBi layer, $E_{cutoff}$ corresponds to the cutoff energy of the superlattice, period corresponds to the thickness of a period of the superlattice, $d_{InAs}$ corresponds to the InAs thickness and $d_{InAsBi}$ corresponds to the thickness of the InAsBi layer. As one illustrative example that can be obtained using the above equations, a strain-balanced Type I superlattice can be designed to have a ground state transition energy of 35 meV corresponding to 10% Bi in InAsBi. Thus, one benefit of using the Type I InAs/InAsBi superlattice is that it restores the rapidly reducing wavefunction overlap square of its Type-II counterpart to a high level (>90%), restoring the strong absorption strength of the superlattice. It will be appreciated that equations similar to equations [3]-[7] having similar but not the same constant values can be used without loss of generality.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An optical device, comprising
a substrate; and
an optically active pseudomorphic superlattice formed on the substrate, the superlattice comprising alternating InAsBi layers with InAs or InAsSb layers, wherein each of InAsBi layers has upper and lower surfaces contacting one of InAs layers or one of InAsSb layers.

2. The device of claim 1, wherein each of the InAsBi layers has a first composition and is a semiconductor or semimetal material having the Bi/In ratio that is varied between about 0.01% and about 20%, and wherein each of the InAs or InAsSb layers has a second composition.

3. The device of claim 2, wherein the first composition and the second composition are chosen such that the InAsSb layers and the InAsBi layers form a Type II superlattice in which conduction and valence bands of the InAsSb layer are offset in the same energy direction relative to respective conduction and valence bands of the InAsBi layers.

4. The device of claim 3, wherein the first and second compositions are chosen such that an absorption edge of the superlattice has a cutoff wavelength that is between the band gap wavelength of InAs and 12 μm at a low temperature and between the band gap wavelength of InAs and 20 μm at room temperature, and such that an absorption coefficient of the superlattice is greater than that of an InAs/InAsSb superlattice by at least 100 cm$^{-1}$ at the cutoff wavelength.

5. The device of claim 2, wherein the first composition and the second composition are chosen such that the InAs layers and the InAsBi layers form a Type I superlattice in which conduction and valence bands of the InAs layers are offset in opposite directions relative to respective conduction and valence bands of the InAsBi layers.

6. The device of claim 5, wherein the first and second compositions are chosen such that an absorption edge of the superlattice has a cutoff wavelength greater than 12 μm, and such that an absorption coefficient of the superlattice is greater than that of an InAs/InAsSb superlattice by at least 100 cm$^{-1}$ at the cutoff wavelength.

7. The device of claim 1, wherein the superlattice is in physical contact with the substrate comprising GaSb.

8. The device of claim 1, wherein the device is an infrared detector configured to absorb a photon having energy equal to or greater than the band gap energy of the superlattice.

9. The device of claim 1, wherein the device is an infrared emitter configured to emit a photon having energy greater than or equal to the band gap energy of the superlattice.

10. The device of claim 1, wherein the superlattice has a thickness exceeding 1 μm and is free of strain-induced dislocations.

11. The device of claim 1, wherein the InAs or InAsSb layers have a first lattice constant selected such that the InAs or InAsSb layers are under a first strain, and the InAsBi layers have a second lattice constant selected such that the InAsBi layers are under a second strain opposite in sign to the first strain, wherein the thicknesses and compositions of the InAsSb or InAs layers and the InAsBi layers are chosen such that a net strain of the superlattice is smaller in magnitude than each of the first strain and the second strain.

12. An optical device, comprising
a substrate having a substrate lattice constant; and
an optically active multilayer stack formed on the substrate, wherein the multilayer stack comprises:
an InAsSb$_y$ layer where y is greater than or equal to zero and a having a first lattice constant selected such that the InAsSb$_y$ layer is under a first strain, and
an InAsBi layer having a second lattice constant selected such that the InAsBi layer is under a second strain opposite in sign to the first strain,
wherein the thicknesses and compositions of the InAsSb$_y$ and InAsBi layers are chosen such that a net strain of the multilayer stack is smaller in magnitude than each of the first strain and the second strain.

13. The device of claim 12, wherein the net strain of the multilayer is between 0% and +0.6% for a thickness of the multilayer stack that is less than 0.1 microns, between 0% and +0.08% for a thickness of the multilayer stack that is less than 1 micron, and between 0% and +0.01% for a thickness of the multiplayer stack that is less than 10 microns.

14. The device of claim 13, wherein the InAsSb$_y$ layer is under a tensile strain and the InAsBi layer is under a compressive strain.

15. The device of claim 14, wherein the InAsSb$_y$ and InAsBi layers of the multilayer stack form a Type I superlattice in which conduction and valence bands of the InAsSb$_y$ layer are offset in opposite directions relative to respective conduction and valence bands of the InAsBi layer.

16. The device of claim 15, wherein the a plurality of InAsSb$_y$ layers and a plurality of InAsBi layers alternate in the multilayer stack to form the Type I superlattice having a period thickness between 1 nm and 20 nm.

17. The device of claim 13, wherein the InAsSb$_y$ layer is under a compressive strain and the InAsBi layer is under a tensile strain.

18. The device of claim 17, wherein the InAsSb$_y$ and InAsBi layers of the multilayer form a Type II superlattice in which conduction and valence bands of the InAsSb$_y$ layer are offset in the same energy direction relative to respective conduction and valence bands of the InAsBi layer.

19. The device of claim 18, wherein a plurality of InAsSb$_y$ layers and a plurality of InAsBi layers alternate in the multilayer stack to form the Type II superlattice having a period thickness between 1 nm and 30 nm.

* * * * *

UNITED STATES PATENT AND TRADEMARK OFFICE
CERTIFICATE OF CORRECTION

| | |
|---|---|
| PATENT NO. | : 9,548,414 B2 |
| APPLICATION NO. | : 14/558410 |
| DATED | : January 17, 2017 |
| INVENTOR(S) | : Preston T. Webster |

It is certified that error appears in the above-identified patent and that said Letters Patent is hereby corrected as shown below:

On the Title Page

In Column 2 item (56) at Line 12, Under Other Publications, change "Nathaniel." to --Nathanial.--.

In the Drawings

Sheet 3 of 8 (Reference Numeral 320, FIG. 3) at Line 5, Change "thicknnesses" to --thicknesses--.

In the Claims

In Column 14 at Line 28 (approx.), In Claim 13, change "+0.6%" to --±0.6%--.

In Column 14 at Line 30 (approx.), In Claim 13, change "+0.08%" to --±0.08%--.

In Column 14 at Line 31 (approx.), In Claim 13, change "+0.01%" to --±0.01%--.

In Column 14 at Line 42 (approx.), In Claim 16, before "a" delete "the".

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*